(12) United States Patent
Ngo et al.

(10) Patent No.: US 9,820,056 B2
(45) Date of Patent: Nov. 14, 2017

(54) ACOUSTIC GALVANIC ISOLATION DEVICE

(71) Applicants: STMicroelectronics (Tours) SAS, Tours (FR); Universite Francois Rabelais, Tours (FR)

(72) Inventors: Sophie Ngo, Tours (FR); Dominique Certon, Saint Avertin (FR); Daniel Alquier, Tours (FR)

(73) Assignees: STMICROELECTRONICS (TOURS) SAS, Tours (FR); Universite Francois Rabelais, Tours (FR)

( * ) Notice: Subject to any disclaimer, the term of this patent is extended or adjusted under 35 U.S.C. 154(b) by 285 days.

(21) Appl. No.: 14/849,964

(22) Filed: Sep. 10, 2015

(65) Prior Publication Data

US 2016/0183007 A1 Jun. 23, 2016

(30) Foreign Application Priority Data

Dec. 17, 2014 (FR) .................... 14 62598

(51) Int. Cl.
| | | |
|---|---|---|
| H03H 9/54 | (2006.01) | |
| H04R 19/00 | (2006.01) | |
| B06B 1/02 | (2006.01) | |
| H03H 9/02 | (2006.01) | |
| H03H 9/48 | (2006.01) | |

(52) U.S. Cl.
CPC ........... H04R 19/00 (2013.01); B06B 1/0292 (2013.01); H03H 9/02228 (2013.01)

(58) Field of Classification Search
CPC ... H04R 19/01; H02J 4/00; B06B 1/02; B06B 1/0292; B06B 1/06; H03H 9/584; H03H 9/54; H04B 1/02; G08B 1/00

USPC .................... 367/140, 137; 333/187
See application file for complete search history.

(56) References Cited

U.S. PATENT DOCUMENTS

| | | | | | |
|---|---|---|---|---|---|
| 3,321,648 | A | * | 5/1967 | Kolm .................. | H03H 9/581 310/321 |
| 4,045,767 | A | * | 8/1977 | Nishihara ............. | H04B 11/00 324/76.31 |
| 4,281,299 | A | * | 7/1981 | Newbold .............. | H03H 9/70 310/314 |
| 5,361,077 | A | * | 11/1994 | Weber .................. | H01Q 1/364 333/192 |
| 5,594,705 | A | * | 1/1997 | Connor ................ | H04B 11/00 310/319 |
| 6,127,942 | A | * | 10/2000 | Welle .................... | H02J 17/00 340/870.16 |

(Continued)

FOREIGN PATENT DOCUMENTS

| | | | | |
|---|---|---|---|---|
| EP | 3034183 A1 | * | 6/2016 | ........... B06B 1/0292 |
| FR | 2954014 A1 | | 6/2011 | |

(Continued)

*Primary Examiner* — Edgardo San Martin
(74) *Attorney, Agent, or Firm* — Gardere Wynne Sewell LLP

(57) ABSTRACT

An acoustic galvanic isolation device includes a substrate capable of transmitting an acoustic wave. A first network of vibrating membrane electroacoustic transducers is arranged on a first surface of the substrate. A second network of vibrating membrane electroacoustic transducers is arranged on a second opposite surface of the substrate. An effective thickness of the substrate exhibits a gradient between the first and second surfaces with respect to propagating the acoustic wave.

20 Claims, 3 Drawing Sheets

(56) References Cited

U.S. PATENT DOCUMENTS

| | | | |
|---|---|---|---|
| 6,625,084 B1 * | 9/2003 | Payton | H04B 11/00 367/134 |
| 6,791,240 B2 | 9/2004 | Mauchamp et al. | |
| 6,903,578 B2 * | 6/2005 | Haigh | H04L 25/0266 326/21 |
| 7,737,807 B2 * | 6/2010 | Larson, III | H03H 9/132 310/318 |
| 7,791,900 B2 * | 9/2010 | Fouquet | H01F 19/08 336/200 |
| 7,902,943 B2 * | 3/2011 | Sherrit | H01L 41/107 310/335 |
| 8,237,534 B2 * | 8/2012 | Fouquet | H01F 27/2804 336/200 |
| 8,385,028 B2 * | 2/2013 | Fouquet | H01F 19/08 336/200 |
| 8,791,624 B2 | 7/2014 | Ngo et al. | |
| 9,450,420 B1 * | 9/2016 | Russell | H02J 4/00 |
| 9,537,582 B2 * | 1/2017 | Ngo | H04B 11/00 |
| 9,662,679 B2 * | 5/2017 | Chen | B06B 1/0292 |
| 2006/0087199 A1 * | 4/2006 | Larson, III | H01L 41/107 310/318 |
| 2007/0085632 A1 * | 4/2007 | Larson, III | H03H 9/587 333/187 |
| 2007/0164631 A1 * | 7/2007 | Adachi | B06B 1/0292 310/311 |
| 2013/0135970 A1 | 5/2013 | Ngo et al. | |
| 2013/0148472 A1 * | 6/2013 | Kovach | H04B 11/00 367/138 |

FOREIGN PATENT DOCUMENTS

| | | | |
|---|---|---|---|
| FR | 2965991 B1 * | 7/2013 | H03H 9/02259 |
| FR | 2983349 B1 * | 12/2013 | H04B 11/00 |

\* cited by examiner

ACOUSTIC GALVANIC ISOLATION DEVICE

PRIORITY CLAIM

This application claims the priority benefit of French Application for Patent No. 1462598, filed on Dec. 17, 2014, the contents of which is hereby incorporated by reference in its entirety to the maximum extent allowable by law.

TECHNICAL FIELD

The present disclosure relates to an acoustic galvanic isolation device.

BACKGROUND

FIG. 1 is a cross-section view schematically showing an example of acoustic galvanic isolation device described in French Patent No. 2954014 (incorporated by reference).

This device comprises a silicon substrate 10 coated on its upper surface with a layer 12A of insulating material. Layer 12A has a network 14A of electroacoustic transducers with vibrating membranes formed thereon. Such transducers are often called CMUT, for "Capacitive Micromachined Ultrasonic Transducer", in the art. Such transducers comprise a conductive layer 16A formed on insulating layer 12A and forming a first electrode common to all transducers. Above conductive layer 16A is formed a layer 17A of a dielectric material. Membranes 18A are defined in layer 17A above cavities 20A. Membranes 18A and opposite cavities 20A have second electrodes 22A formed thereon. One or a plurality of contacts 24A are formed on first electrode 16A. Electrodes 22A are connected to a node 26A.

Symmetrically, the lower surface of substrate 10 comprises elements 12B, 14B, 16B, 17B, 18B, 20B, 22B, 24B, and 26B homologous to elements 12A, 14A, 16A, 17A, 18A, 20A, 22A, 24A, and 26A.

In operation, a D.C. bias voltage is applied between contacts 24A and 26A of first network 14A of transducers and between contacts 24B and 26B of second network 14B of transducers. An A.C. voltage of frequency $f_0$ (input signal) is applied to first transducer network 14A, between contacts 24A and 26A. Such an A.C. voltage creates an oscillation at frequency $f_0$ of membranes 18A of the transducers of network 14A. The generated acoustic ultrasound waves propagate in substrate 10 towards transducer network 14B. The substrate thickness is selected to promote the propagation of acoustic waves of frequency $f_0$. The acoustic waves transmitted by substrate 10 reach the transducers of second network 14B, which causes the vibration of their membrane 18B. This results in the appearing of an A.C. voltage of frequency $f_0$ (output signal) between contacts 24B and 26B.

When the input signal frequency drifts away from frequency $f_0$ for which the thickness of substrate 10 has been selected, a strong attenuation of the amplitude of the output signal can be observed. Thus, such an acoustic galvanic isolation device only operates properly if the frequency of the input signal remains close to a determined frequency $f_0$. This implies associating with the acoustic galvanic isolation device an A.C. input signal generator delivering a frequency which remains close to frequency $f_0$ of optimal operation of the device. The provision of such a generator delivering, with no drift, an accurate frequency results in that this generator should be relatively sophisticated and that its cost is high.

An acoustic galvanic isolation device which can accept an A.C. input signal having its frequency within a relatively wide range is thus needed.

SUMMARY

Thus, an embodiment provides an acoustic galvanic isolation device comprising a substrate capable of transmitting an acoustic wave, a first network of vibrating membrane electroacoustic transducers arranged on a first surface of the substrate, and a second network of vibrating membrane electroacoustic transducers arranged on a second opposite surface of the substrate, wherein the substrate has an effective thickness gradient between the first and second surfaces.

According to an embodiment, the substrate is made of non-porous silicon and or porous silicon, and the first and second surfaces are planar and parallel to each other, the interface between the non-porous silicon and the porous silicon being non-planar.

According to an embodiment, the thickness of the non-porous silicon varies discretely.

According to an embodiment, the surface of the non-porous silicon in contact with the porous silicon is concave.

According to an embodiment, the substrate is made of a single material.

According to an embodiment, the thickness of the material varies discretely.

According to an embodiment, one at least of the first and second surfaces is concave.

According to an embodiment, the substrate further comprises porous silicon areas arranged at the periphery of the substrate and extending from the first to the second surface.

According to an embodiment, the acoustic wave has a frequency in the range from a high frequency $f_{max}$ to a low frequency $f_{min}$, and the substrate has a maximum effective thickness $L_{max}$ and a minimum effective thickness $L_{min}$ selected to be such that:

$$L_{max} = n\frac{c}{2f_{min}}, \text{ and}$$

$$L_{min} = n\frac{c}{2f_{max}},$$

n being an integer, and c designating the velocity of acoustic waves in the material(s) of the substrate.

According to an embodiment, the device comprises means capable of modifying the biasing of the transducers to adapt the resonance frequency of the transducers to the frequency of the acoustic wave.

BRIEF DESCRIPTION OF THE DRAWINGS

The foregoing and other features and advantages will be discussed in detail in the following non-limiting description of specific embodiments in connection with the accompanying drawings.

DETAILED DESCRIPTION OF THE DRAWINGS

Figure 1:
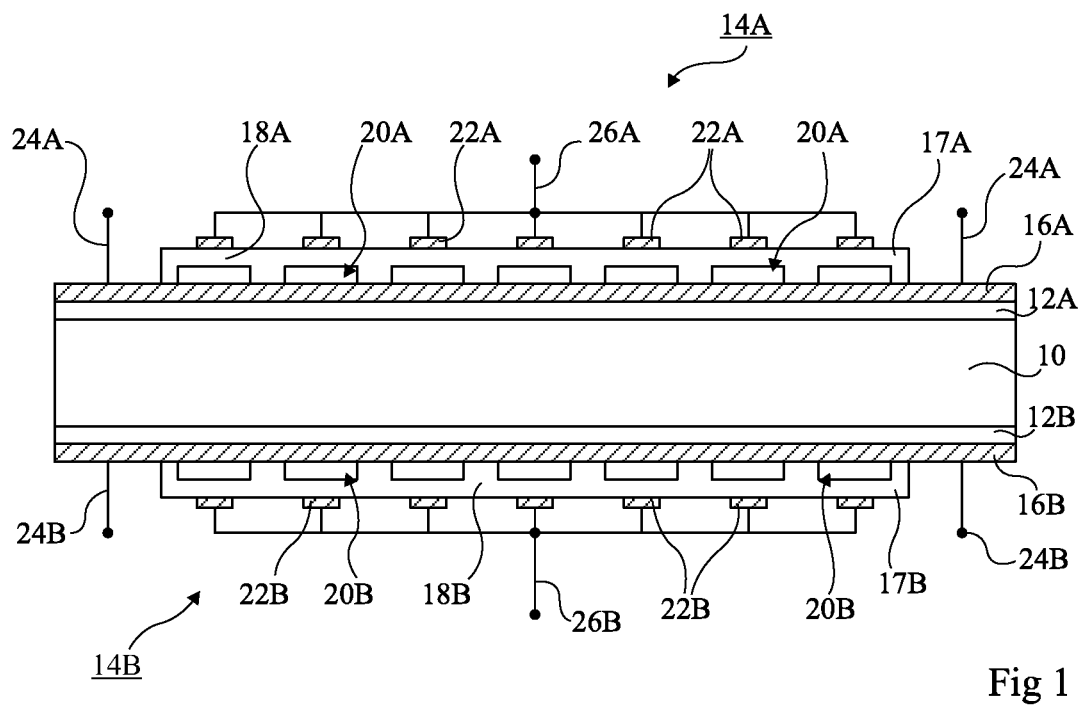
FIG. 1, previously described, schematically shows an example of an acoustic galvanic isolation device described in French Patent No. 2954014.

In FIGS. 2 to 8, the same elements have been designated with the same reference numerals and, further, the drawings are not to scale. For clarity, in these drawings, CMUT transducers are shown in simplified fashion. Further, terms such as "upper", "lower", "lateral", etc., apply to devices oriented as illustrated in the corresponding drawings, it being understood that, in practice, the devices may have different orientations. In the following description, unless otherwise indicated, term "substantially" means "to within 10%".

Figure 2:
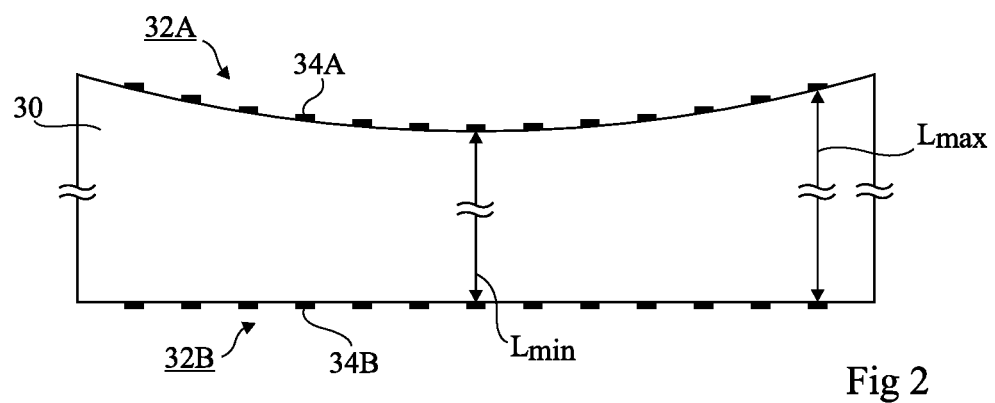
FIG. 2 is a cross-section view schematically showing an acoustic galvanic isolation device.

FIG. 2 is a cross-section view schematically showing an acoustic galvanic isolation device provided to transmit A.C. signals between input and output signals of vibrating membrane electroacoustic transducers.

The device comprises a substrate 30 made of any material capable of transmitting ultrasound acoustic waves. First and second networks 32A and 32B of CMUT-type electroacoustic transducers 34A and 34B are respectively arranged on the upper and lower surfaces of substrate 30. Each of the components of these networks is formed as described in relation with FIG. 1. The lower surface of substrate 30 is planar and the upper surface of the substrate is non-planar (for example, concave). As a result, substrate 30 has a thickness gradient between its upper and lower surfaces extending along a lateral dimension of the substrate perpendicular to the direction of acoustic wave propagation. The thickness of substrate 30 varies along this lateral dimension from a maximum value $L_{max}$ to a minimum value $L_{min}$, thicknesses $L_{max}$ and $L_{min}$ of the substrate promoting the propagation of acoustic waves of respective frequencies $f_{min}$ and $f_{max}$.

Thus, the device of FIG. 2 transmits with substantially the same intensity A.C. input signals each having a different frequency within a relatively wide frequency range extending from a low frequency $f_{min}$ to a high frequency $f_{max}$.

Figure 3:
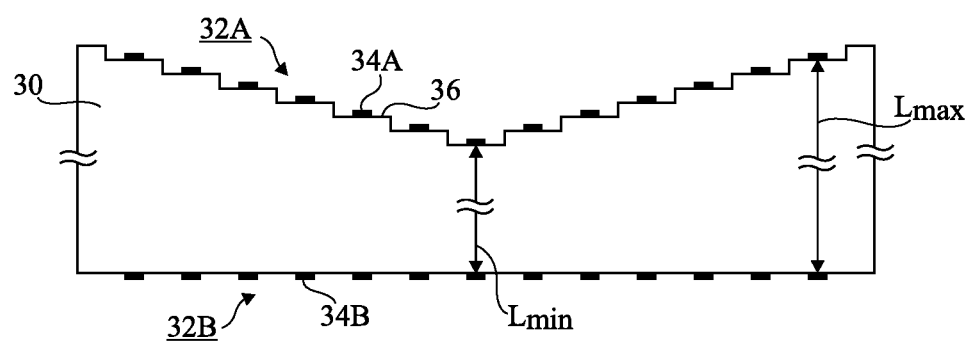
FIG. 3 is a cross-section view schematically showing an embodiment of the device of FIG. 2.

FIG. 3 is a cross-section view schematically showing an embodiment of the device of FIG. 2. In this embodiment, the concave upper surface of substrate 30 is structured in stepped stages 36 along the lateral dimension. In the shown cross-section view, for simplification, a single transducer 34A is arranged across the width of each stage 36. Since the stages have planar upper surfaces, each transducer 34A extends parallel to transducers 34B.

Figure 4:
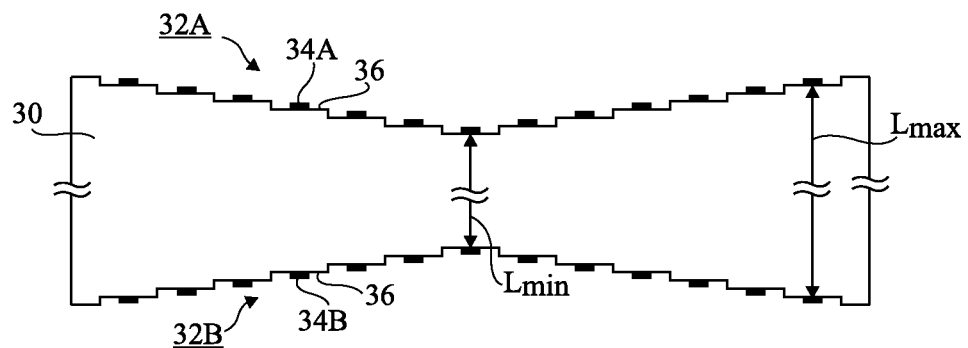
FIG. 4 is a cross-section view schematically showing an alternative embodiment of the device of FIG. 2.

FIG. 4 is a cross-section view schematically showing an alternative embodiment of the device of FIG. 2. In this variation, the upper and lower surfaces of substrate 30 are both concave and structured in stepped stages 36 along the lateral dimension.

As an example, in the devices of FIGS. 2 to 4, substrate 30 is made of silicon or of glass. The profile of the upper surface, and possibly that of the lower surface, of the substrate may be obtained by etching. In the case where the upper and lower surfaces of substrate 30 are both concave, two substrate portions may be etched separately and then bonded to each other, for example, by molecular bonding.

Figure 5:
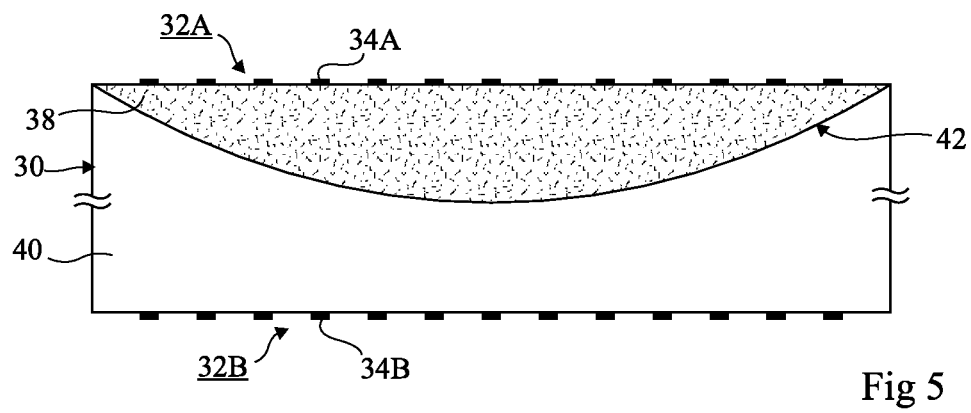
FIG. 5 is a cross-section view schematically showing another embodiment of an acoustic galvanic isolation device.

FIG. 5 is a cross-section view schematically showing another embodiment of an acoustic galvanic isolation device provided to transmit A.C. signals between input and output networks of vibrating membrane electroacoustic transducers.

The device comprises a substrate 30, and first and second networks 32A and 32B of transducers 34A and 34B of CMUT type. Substrate 30 comprises an upper portion 38 made of porous silicon and a lower portion 40 made of non-porous silicon, for example, made of single-crystal silicon. The upper and lower surfaces of substrate 30 are planar and parallel to each other. Upper surface 42 of portion 40 in contact with portion 38 is concave along the lateral dimension.

In operation, when a wave propagates in substrate 30 from a transducer 34A to an opposite transducer 34B, it crosses porous silicon and non-porous silicon. For a substrate having a given porous silicon thickness and a given non-porous silicon thickness, the thickness that a non-porous silicon substrate crossed within the same time by an acoustic wave of same frequency would have is called effective thickness of the substrate.

Substrate 30 has an effective thickness gradient along the lateral dimension. Thus, as discussed in relation with the device of FIG. 2, the device of FIG. 5 efficiently transmits signals within a relatively wide frequency range. By selecting the thicknesses of portions 38 and 40 and the profile of surface 42 along the lateral dimension so that the effective thickness of substrate 30 varies from $L_{min}$ to $L_{max}$, this frequency range will extend from $f_{min}$ to $f_{max}$.

Further, due to the fact that the upper and lower surfaces of substrate 30 are planar, the deposition and etching operations necessary to form transducers 34A and 34B are simplified with respect to the case where these surfaces are curved or comprise portions located at different heights.

As an example, the porous silicon may be obtained by depositing on the upper surface of a silicon substrate a resistive mask having a thickness which varies complementarily to the thickness of porous silicon which is desired to be formed, and then by carrying out an electrochemical anodizing step, that is, by immersing the substrate into an electrolytic bath and by circulating a current through the mask and the substrate.

Figure 6:
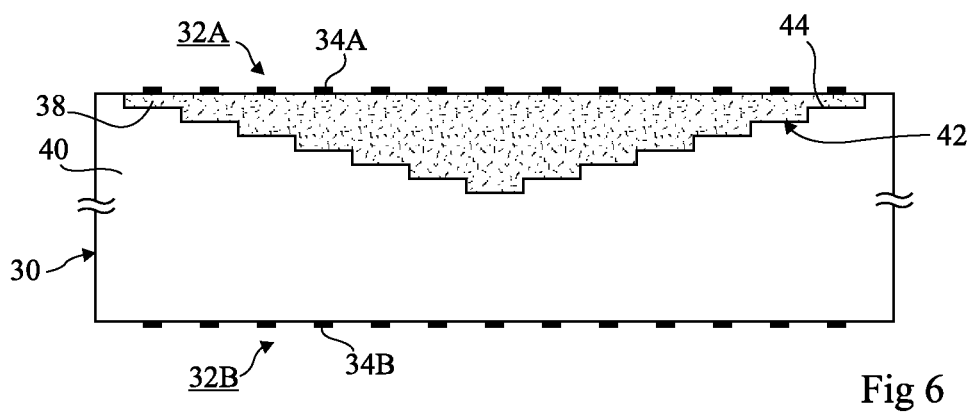
FIG. 6 is a cross-section view schematically showing an alternative embodiment of the device of FIG. 5.

FIG. 6 is a simplified cross-section view of an alternative embodiment of the device of FIG. 5. In this variation, instead of being regularly concave, upper surface 42 of portion 40 is structured in stepped stages 44 along the lateral dimension. Thus, the thickness of upper portion 38 of the substrate varies discretely. As a result, the forming of the porous silicon is simplified. As an example, the various porous silicon thicknesses may be obtained by repeating steps of deposition of an insulating mask on portions of the upper surface of a substrate, and of electrochemical anodizing of this substrate.

Figure 7:
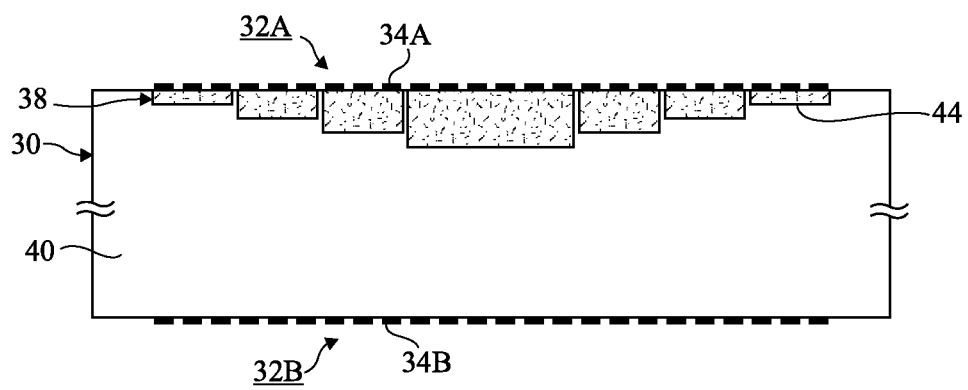
FIG. 7 is a cross-section view schematically showing an alternative embodiment of the device of FIG. 6.

FIG. 7 is a cross-section view schematically showing an alternative embodiment of the device of FIG. 6. In this variation, the porous silicon portions of various depths are separate from each other along the lateral dimension. A plurality of transducers 34A are arranged across the width of each porous silicon portion.

It should be noted that stepped embodiments such as those of FIGS. 5 to 7 may comprise a limited number of stages only, for example, 4 as shown in FIG. 7. The number of steps necessary to form such as device is thus limited.

Figure 8:
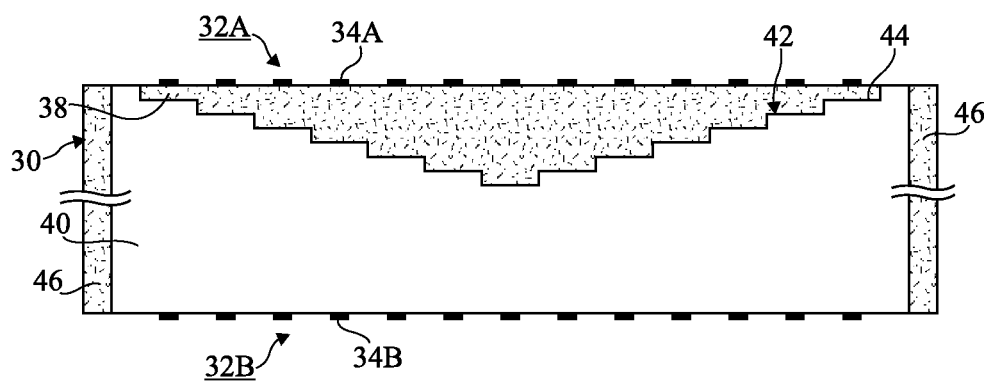
FIG. 8 is a cross-section view schematically showing another alternative embodiment of the device of FIG. 6.

FIG. 8 is a cross-section view schematically showing another alternative embodiment of the device of FIG. 6. In this variation, porous silicon 46 extends at the periphery of substrate 30, from the upper face to the lower surface thereof. Porous silicon 46 limits the propagation of possible transverse acoustic waves. This results in a decrease in edge effects. This layout may also be provided in the devices of FIGS. 2 to 4 in the case where substrate 30 is made of silicon, and in the devices of FIGS. 5 to 7.

In the devices of FIGS. 2 to 8, values $L_{min}$ and $L_{max}$ of the effective substrate thickness along the lateral dimension are selected according to the frequency of the A.C. input signal, ranging from a minimum frequency $f_{min}$ to a maximum frequency $f_{max}$. This effective thickness corresponds to the real thickness of the substrate in the devices of FIGS. 2 to 4, and takes into account the stacking of porous silicon and of non-porous silicon in the devices of FIGS. 5 to 8. In particular, $L_{min}$ and $L_{max}$ are selected to be such that:

$$L_{max} = n\frac{c}{2f_{min}}, \text{ and}$$

$$L_{min} = n\frac{c}{2f_{max}},$$

n being an integer and c designating the velocity of sound in the material or the assembly of materials of the substrate in a direction from one transducer network to another. As an example, for $f_{min}$=11 MHz, $f_{max}$=13 MHz, n=2 and a silicon substrate 30, c=8,433 m·s$^{-1}$, $L_{min}$=648.7 µm, and $L_{max}$=766.7 µm.

Specific embodiments have been described. Various alterations and modifications will occur to those skilled in the art. In practice, networks 32A and 32B comprise a large number of transducers 34A and 34B, for example, from several thousands to several tens of thousands of transducers.

In the devices of FIGS. 2 to 8, substrates having a variable effective thickness have been described. To further decrease intensity differences between signals transmitted at different frequencies, it may be provided to adapt the resonance frequency of transducers 34A and 34B to the frequency of the A.C. input signal. This may for example be done as described in United States Patent Application Publication No. 2013/0135970 (incorporated by reference), without modifying the structural characteristics of transducers 34A and 34B, but only by modifying the bias voltage of these transducers according to the frequency of the A.C. signal. A feedback control between the frequency of the input signal and this bias voltage may be provided.

Different types of vibrating membrane electroacoustic transducers may be used in the devices of FIGS. 2 to 8. For example, it may be provided to use CMUT-type transducers such as those described in U.S. Pat. No. 8,791,624 (incorporated by reference) to uncouple the A.C. voltages applied to transducers 34A and 34B of the D.C. voltages used to bias these transducers.

In the devices of FIGS. 2 to 8, substrate 30 is symmetrical with respect to a central axis. Substrate 30 may however not be symmetrical. Further, the upper surface and possibly the lower substrate of the substrate of the devices of FIGS. 2 to 4 may have profiles other than concave. Similarly, the profile of the interface between the porous silicon and the non-porous silicon of the substrate of the devices of FIGS. 5 to 8 may be modified.

Similarly to what has been described in relation with FIG. 7, a plurality of transducers 34A may be arranged across the width of each stage 36 of the devices of FIGS. 3 and 4, and a plurality of transducers 34A may be arranged on the upper surface of the substrate opposite a same stage 44 of the devices of FIGS. 6 and 8.

In the devices of FIGS. 5 to 8, to vary the effective thickness of the substrate, similarly to what has been described in relation with FIG. 4, porous silicon may be formed on the lower surface side and on the upper surface side of the substrate.

Various embodiments with different variations have been described hereabove. Those skilled in the art may combine various elements of these various embodiments and variations without showing any inventive step.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. An acoustic galvanic isolation device, comprising:
   a substrate configured for transmitting an acoustic wave;
   a first network of vibrating membrane electroacoustic transducers arranged on a first surface of the substrate; and
   a second network of vibrating membrane electroacoustic transducers arranged on a second surface of the substrate opposite the first surface;
   wherein the substrate has an effective thickness gradient between the first and second surfaces.

2. The device of claim 1, wherein the substrate includes a non-porous silicon portion and a porous silicon portion, wherein the first and second surfaces are planar and parallel to each other, and wherein an interface between the non-porous silicon portion and the porous silicon portion is non-planar.

3. The device of claim 2, wherein a thickness of the non-porous silicon portion defining the non-planar interface varies in discrete steps.

4. The device of claim 2, wherein the interface between the non-porous silicon portion and the porous silicon portion is concave.

5. The device of claim 1, wherein the substrate is made of a single material.

6. The device of claim 5, wherein a thickness of the single material of the substrate varies in discrete steps.

7. The device of claim 5, wherein at least one of the first and second surfaces is concave.

8. The device of claim 1, wherein the substrate includes a non-porous silicon portion and a plurality of porous silicon areas arranged at a periphery of the substrate and extending from the first surface to the second surface.

9. The device of claim 1, wherein the acoustic wave has a frequency in a range from a high frequency $f_{max}$ to a low frequency $f_{min}$, and the substrate has a maximum effective thickness $L_{max}$ and a minimum effective thickness $L_{min}$ selected to be such that:

$$L_{max} = n\frac{c}{2f_{min}}, \text{ and}$$

$$L_{min} = n\frac{c}{2f_{max}},$$

n being an integer, and c designating the velocity of acoustic waves in the material(s) of the substrate.

10. The device of claim 1, further comprising means capable of modifying the biasing of the transducers to adapt the resonance frequency of the transducers to the frequency of the acoustic wave.

11. The device of claim 1, wherein the substrate includes a non-porous silicon portion and a plurality of porous silicon areas arranged in the first surface, each porous silicon area associated with at least one transducer and each porous silicon area having a different depth extending into the substrate from the first surface.

12. An acoustic galvanic isolation device, comprising:
a substrate configured for transmitting an acoustic wave;
a first network of vibrating membrane electroacoustic transducers arranged along a lateral dimension on a first surface of the substrate; and
a second network of vibrating membrane electroacoustic transducers arranged along the lateral dimension on a second surface of the substrate opposite the first surface;
wherein an effective thickness for acoustic propagation between the first surface and second surface varies along the lateral dimension.

13. The device of claim 12, wherein the effective thickness varies in discrete steps along the lateral dimension.

14. The device of claim 13, wherein the first surface is a stepped surface.

15. The device of claim 13, wherein the first and second surfaces are planar and parallel to each other, the substrate comprises a non-porous silicon portion and a porous silicon portion in contact with each other at an interface that is stepped along the lateral dimension.

16. The device of claim 13, wherein the first and second surfaces are planar and parallel to each other, the substrate comprises a non-porous silicon portion and a plurality of porous silicon regions formed in the first surface, separated from each other and having different depths along the lateral dimension.

17. The device of claim 12, wherein the effective thickness varies continuously along the lateral dimension.

18. The device of claim 17, wherein the first surface is a continuously curved concave surface along the lateral dimension.

19. The device of claim 17, wherein the first and second surfaces are planar and parallel to each other, the substrate comprises a non-porous silicon portion and a porous silicon portion in contact with each other at an interface that has a continuously curved concave shape along the lateral dimension.

20. The device of claim 12, wherein the substrate includes a non-porous silicon portion and a plurality of porous silicon areas arranged at a periphery of the substrate and extending from the first surface to the second surface.

* * * * *